United States Patent [19]

Rogers

[11] 4,249,194
[45] Feb. 3, 1981

[54] INTEGRATED CIRCUIT MOS CAPACITOR USING IMPLANTED REGION TO CHANGE THRESHOLD

[75] Inventor: Gerald D. Rogers, Houston, Tex.

[73] Assignee: Texas Instruments Incorporated, Dallas, Tex.

[21] Appl. No.: 828,359

[22] Filed: Aug. 29, 1977

Related U.S. Application Data

[63] Continuation of Ser. No. 645,171, Dec. 29, 1975, abandoned.

[51] Int. Cl.² .................... H01L 27/02; H01L 29/78; H01L 29/34
[52] U.S. Cl. ................................ 357/51; 357/24; 357/23; 357/52; 357/14
[58] Field of Search ................. 357/14, 24, 52, 51, 357/23

[56] References Cited

U.S. PATENT DOCUMENTS

| | | | |
|---|---|---|---|
| 3,387,286 | 6/1968 | Dennard | 357/41 |
| 3,591,836 | 7/1971 | Booher | 357/14 |
| 3,740,731 | 6/1973 | Ohwada et al. | 357/14 |
| 3,810,125 | 5/1974 | Stein | 357/52 |
| 3,906,539 | 9/1975 | Sauermann | 357/52 |
| 3,996,658 | 12/1976 | Takei et al. | 357/24 |
| 4,031,608 | 6/1977 | Togei et al. | 357/52 |
| 4,047,215 | 9/1977 | Frye et al. | 357/91 |
| 4,115,794 | 9/1978 | Delamoneda | 357/91 |

OTHER PUBLICATIONS

IBM Technical Disclosure Bulletin; vol. 15, No. 9, Feb. 1973, by Lee et al. p. 2833.

Primary Examiner—Andrew J. James
Attorney, Agent, or Firm—John G. Graham

[57] ABSTRACT

An MOS capacitor for N-channel silicon gate integrated circuits employs a polycrystalline silicon layer as one plate, and a silicon oxide dielectric. The lower plate consists of a region which is implanted by an ion beam to produce a depleted region. This device has a constant capacitance regardless of gate voltage in normal operating logic levels.

7 Claims, 4 Drawing Figures

INTEGRATED CIRCUIT MOS CAPACITOR USING IMPLANTED REGION TO CHANGE THRESHOLD

This application is a continuation of Ser. No. 645,171 filed Dec. 29, 1975 (now abandoned).

BACKGROUND OF THE INVENTION

This invention relates to semiconductor devices, and more particularly to capacitors for N-channel silicon gate integrated circuits.

Integrated circuits have long used silicon oxide dielectric or MOS capacitors as set forth in Kilby's U.S. Pat. No. 3,350,760, issued Nov. 7, 1967. The advantage of these devices is that a capacitor is created by the same fabrication steps used to make the other elements of the integrated circuit. In N-channel silicon gate circuits, so-called gated capacitors are often used, as for storage capacitors in RAM cells set forth in Electronics, Sept. 23, 1973, p. These devices are of great utility, but it is sometimes a disadvantage that the capacitance is dependent on the voltage applied to the silicon gate and the adjacent diffused region of the device.

It is the object of this invention to provide an improved capacitor of the type used in integrated circuits, particularly N-channel silicon gate devices. Another object is to provide an MOS capacitor of the gated capacitor type wherein the voltage on the gate does not change the magnitude of capacitance. An additional object is to provide a capacitor which has the same value regardless of the polarity of voltage applied.

SUMMARY OF THE INVENTION

An MOS capacitor for N-channel silicon gate integrated circuits employs a polycrystalline silicon layer as one plate, and a silicon oxide dielectric. The lower plate consists of a region which is implanted by an ion beam to produce a different threshold voltage. In one embodiment the implant produces depleted region. This device depletion has a constant capacitance regardless of gate voltage in normal operating logic levels.

THE DRAWINGS

The novel features believed characteristic of the invention are set forth in the appended claims. The invention itself, however, as well as other features and advantages thereof, will best be understood by reference to the following detailed description of a particular embodiment, when read in conjunction with the accompanying drawings, wherein:

FIG. 1b is a plan view of the capacitor of FIG. 1a;

DETAILED DESCRIPTION OF SPECIFIC EMBODIMENT

Figure 1A:
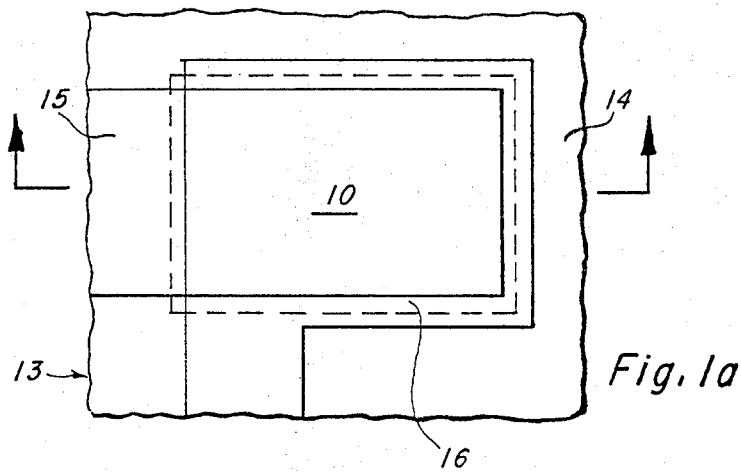
FIG. 1a is a elevation view in section of a silicon bar containing the capacitor of the invention.
Figure 1B:
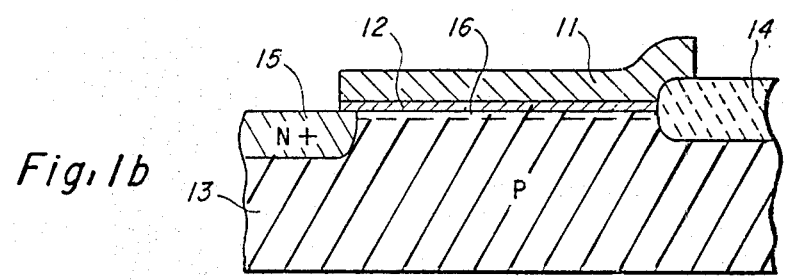

Referring to FIGS. 1a and 1b, a capacitor 10 according to the invention is illustrated. The capacitor includes an upper plate 11 which is composed of polycrystalline silicon, doped with phosphorus to be highly conductive. The capacitor dielectric is a thin layer 12 of silicon oxide, about 1000 Å in thickness, overlying a small area of the face of a monocrystalline silicon bar 13. Thick field oxide 14 exists a large part of the face of the bar, this oxide being about 10,000 Å. An N+ diffused region 15 of about 8,000 Å depth is provided in the face of the bar 13, as would usually provide the source and drain regions of MOS transistors as well as interconnections between components. An ion implanted region 16 is provided as the lower plate of the capacitor 10. The region 16 is contacted by the region 15 at its edge.

The device of FIGS. 1a and 1b is made by a process which begins with applying thin coatings of silicon oxide and nitride to a face of a P-type silicon slice, and the nitride is selectively removed using photoresist to expose the areas where thick oxide 14 is to be grown. The areas 15 and 16 are covered by nitride. When the oxide 14 is grown by exposing to an oxidizing atmosphere at high temperature, the surface of the silicon is consumed so the oxide is seen to extend into the face of the silicon. Next, the remaining nitride mask is removed and the slice is subjected to an ion implant operation wherein the region 16 is produced. Phosphorus atoms are implanted by an ion beam at about 50 KeV at a dosage of about $50 \times 10^{11}$ atoms/cm$^2$. Next, thin oxide layer 12 is grown, and the slice is coated with polysilicon which is patterned using photoresist to leave the layers 11 and 12. The slice is subjected to an N-type diffusion to create the region 15, using the layer 12 as a mask. The device is completed by covering with thick low temperature oxide, holes are opened in the oxide, and a metal interconnection pattern is provided by deposition of aluminum and photoresist patterning. The device is usually part of a complex integrated circuit which contains thousands of MOS transistors and other devices on a chip which is perhaps 150 to 200 mils on a side. The device of FIGS. 1a and 1b is only about five to ten mils squared in size, depending on the magnitude of capacitance needed.

Figure 2:
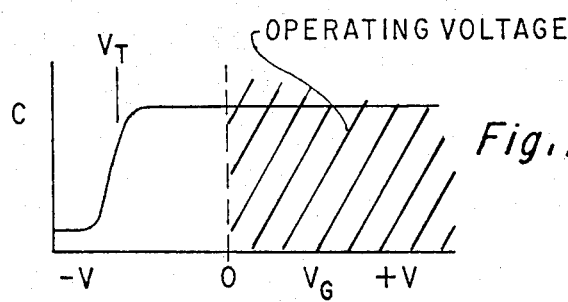
FIGS. 2 and 3 are graphs of capacitance vs. voltage for the device of FIGS. 1a and 1b.
Figure 3:
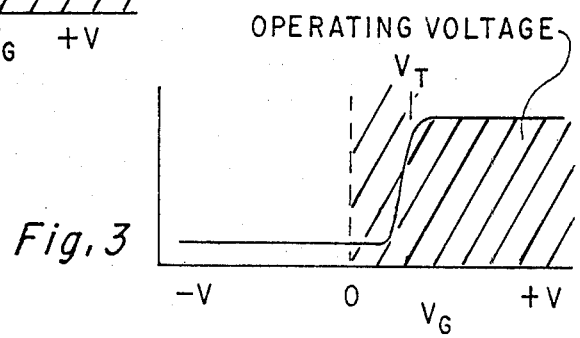

FIG. 2 shows the capacitance per square mil for the device of FIGS. 1a and 1b, made as described above. Note that the threshold voltage is shifted to a negative value compared to FIG. 3 which is the equivalent graph of the device of FIGS. 1a and 1b without the ion implant region 16. The operating region of the device of FIG. 2 is in the shaded area because N-channel devices are operated at logic levels of Vss or ground to about +12 volts. In the embodiment device of FIG. 3, under zero logic levels the capacitance is markedly larger from at one logic level. Another advantage of the device of FIG. 1a and 1b is that the capacitance between gate 11 and drain 15 is the same regardless of the polarity of connection; this was not true in enhancement device which were responsive to having the drain connected to a given node.

While this invention has been described with reference to an illustrative embodiment, it is not intended that this description be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. In a semiconductor integrated circuit, an MOS capacitor of the type having:
   a. a silicon body having a major face and having a predominately P-type original impurity concentration;
   b. a thin layer of thermal silicon oxide dielectric on a part of the major face;

c. a polycrystalline silicon conductive layer overlying said layer of dielectric to provide one plate of a capacitor and means for applying a positive voltage to said conductive layer;

d. a capacitor region in the surface of said major face underlying the layer of dielectric to provide the other plate of the capacitor;

e. and contact means including a heavily doped N+ region in the silicon body on said one face contiguous with an edge of the capacitor region and providing electrical connection thereo, the improvement wherein: the capacitor region contains ion implanted conductivity-determining impurity material introduced into the silicon in addition to said original impurity concentration to substantially lower the threshold voltage at which said capacitor region inverts thereby causing the MOS capacitor to exhibit a high magnitude of capacitance at voltages applied to the conductive layer which are low compared to the threshold voltage of the device without such conductivity-determining impurity material introduced, the capacitor region being much thinner than the N+ region.

2. In an MOS capacitor according to claim 1, the capacitor region exhibiting said high magnitude of capacitance at zero volts.

3. In a semiconductor integrated circuit device of the type formed in a predominately P-type silicon body, an MOS capacitor of the type having a thin layer of thermal silicon oxide dielectric on a part of a major face of the body, a conductive layer composed of doped polycrystalline silicon over the dielectric layer to provide one plate of the capacitor, means for applying a selected voltage to the conductive layer, a capacitor region in said part of the major face underlying the dielectric layer to provide the other plate of the capacitor, the capacitor region being P-type for voltage more negative than the selected voltage, and means including an N+ region for making electrical connection to the capacitor region, the improvement wherein:

the capacitor region is ion-implanted with conductivity-determining impurity material of type opposite that which underlies the capacitor region to substantially lower the magnitude of said selected voltage necessary on the conductive layer to deplete the capacitor region thereby providing a high magnitude of capacitance at relatively low voltage on the conductive layer, the capacitor region being much thinner than the N+ regions.

4. An MOS capacitor according to claim 3, wherein the capacitor region is ion-implanted with phosphorus, and the silicon body is predominantly P-type beneath said capacitor region.

5. An MOS capacitor according to claim 3, wherein the capacitor is implanted to a dosage such as to create a depletion mode device in place of an enhancement mode device.

6. An MOS capacitor according to claim 4, wherein the means for applying a selected voltage applies a bias potential of a given operating range between the conductive layer and the capacitor region, the threshold voltage for depleting the capacitor being below the operating range.

7. An MOS capacitor according to claim 6, wherein the operating range is from zero to a positive voltage and the threshold voltage is a negative voltage.

* * * * *